United States Patent [19]

Morisaki et al.

[11] Patent Number: 5,441,918
[45] Date of Patent: Aug. 15, 1995

[54] METHOD OF MAKING INTEGRATED CIRCUIT DIE PACKAGE

[75] Inventors: Maysayuki Morisaki, Tokyo; Hiroshi Matsumoto; Shoji Uegaki, both of Kyoto, all of Japan

[73] Assignee: LSI Logic Corporation, Milpitas, Calif.

[21] Appl. No.: 148,810

[22] Filed: Nov. 8, 1993

Related U.S. Application Data

[62] Division of Ser. No. 11,659, Jan. 29, 1993.

[51] Int. Cl.$^6$ ............................................. H01L 21/60
[52] U.S. Cl. ................................... 437/209; 437/211; 437/214; 437/217; 437/219; 437/220
[58] Field of Search ............... 437/209, 211, 212, 213, 437/214, 215, 216, 217, 218, 219

[56] References Cited

U.S. PATENT DOCUMENTS

| | | | |
|---|---|---|---|
| 3,650,778 | 3/1972 | Dumesnil et al. | 106/47 R |
| 3,706,840 | 12/1972 | Moyle et al. | 172/52 PE |
| 4,142,203 | 2/1979 | Dietz | 357/80 |
| 4,143,456 | 3/1979 | Inoue | 29/588 |
| 4,218,701 | 8/1980 | Shirasaki | 357/72 |
| 4,622,433 | 11/1986 | Frampton | 437/218 |
| 4,633,573 | 1/1987 | Scherer | 437/211 |
| 4,691,225 | 9/1987 | Murakami et al. | 357/80 |
| 4,827,082 | 5/1989 | Horiuchi et al. | 174/52.4 |
| 4,908,086 | 3/1990 | Goodrich et al. | 437/218 |
| 5,037,779 | 8/1991 | Whalley et al. | 437/218 |
| 5,057,903 | 10/1991 | Olla | 357/72 |
| 5,068,708 | 11/1991 | Newman | 357/68 |
| 5,070,041 | 12/1991 | Katayama et al. | 437/214 |
| 5,102,829 | 4/1992 | Cohn | 437/209 |
| 5,122,858 | 6/1992 | Mahulikar et al. | 357/70 |
| 5,175,612 | 12/1992 | Long et al. | 257/667 |
| 5,208,188 | 5/1993 | Newman | 437/220 |
| 5,237,205 | 8/1993 | Newman | 257/783 |

FOREIGN PATENT DOCUMENTS 62-232944 10/1987 Japan .
63-152156 6/1988 Japan .

Primary Examiner—Brian E. Hearn
Assistant Examiner—Kevin M. Picardat
Attorney, Agent, or Firm—John P. Taylor

[57] ABSTRACT

A package for integrated circuit dies is disclosed comprising a ceramic base capable of having an integrated circuit die mounted to a central portion of one surface thereof to provide heat dissipation for the die; a lead frame with a central opening secured to the periphery of the same surface of the ceramic base; a raised frame member secured to both the lead frame and the peripheral portions of the same surface of the ceramic base exposed between the leads on the lead frame; a die mounted to the exposed central portion of the surface of the ceramic base surrounded by the lead frame and the raised frame member, and electrically bonded to leads on the lead frame; and a plastic potting material over and around the edges of the integrated circuit die and in contact with the exposed portion of the surface of the ceramic base adjacent the die, portions of the lead frame; and inner portions of the raised frame member to thereby encapsulate the integrated circuit die. The package is formed by first bonding a lead frame having a central opening (no die paddle) to the ceramic base. A raised frame member having a similarly shaped central opening is then bonded to the lead frame, and the ceramic base, leaving a central exposed portion of the surface of the ceramic base surrounded by the lead frame and raised frame member. The die is then bonded to this exposed surface of the ceramic base and then encapsulated with a potting resin after wire bonding of the die to the leads.

20 Claims, 3 Drawing Sheets

METHOD OF MAKING INTEGRATED CIRCUIT DIE PACKAGE

This is a divisional of application Ser. No. 08/011,659 filed on Jan. 29, 1993.

BACKGROUND OF THE INVENTION

1. Field of the Invention

This invention relates to the packaging of integrated circuit dies. More particularly, this invention relates to an improved structure and method for packaging integrated circuit dies which incorporates advantages of both ceramic and plastic packaging.

2. Description of the Related Art

Conventionally, integrated circuit dies or chips have been packaged either in hermetically sealed ceramic containment structures or by encapsulating the die in plastic. While the hermetically sealed ceramic structure provides an excellent packaging of the integrated circuit die, it is an expensive construction, since the hermetic seal must be of sufficient quality so that moisture and other contaminants cannot penetrate into the package and damage the integrated circuit die therein.

The difficulties and expense encountered in providing a ceramic package with an adequate hermetic seal have, in the past, led those skilled in the art to utilize plastic packaging materials instead, which are used to encapsulate the integrated circuit die. By first attaching the die physically and electrically to a lead frame and then completely surrounding the die with plastic, the die was effectively sealed from contaminants as long as high quality plastic encapsulation material was used.

However, the use of plastic-encapsulated packaging has not been without its problems. In the first place, the die (and the portions of the lead frame immediately adjacent the die) are conventionally encapsulated in plastic by inserting the die and lead frame into a mold in a plastic injection press and plastic material is then injected under high pressure into the mold. To prevent the injected plastic from escaping from the mold via the spaces in between the individual leads on the lead frame, dams of removable metals are usually placed between the leads. These dams are then subsequently removed after the encapsulation step. However, since the injected plastic terminates at one side of the dams, removal of the dams without damage to the integrated circuit package, including the plastic encapsulant, requires special tools and the exercise of considerable care.

The encapsulation of the die in plastic requires the injection of such plastic under pressure. This, in turn, necessitated the use of short and stiff bonding wires between the leads of the lead frame and the contacts on the integrated circuit die. Longer leads could be bent, under the pressure of the injected plastic, to short against adjacent bonding wires. Furthermore, bonding wires which were not sufficiently thick would not possess the requisite stiffness to inhibit either bending or breakage of the bonding wire induced by the pressure of the injected plastic.

Heat dissipation is also not as satisfactory using plastic encapsulation since ceramic materials are better heat conductors. Thus, the use of plastic encapsulation has resulted in the need for employment of metal heat sinks and/or the use of central die paddles in the metal lead frame to assist in conducting the heat away from the die during operation of the integrated circuit die.

The use of a die paddle or other suitable die support means is also necessitated in plastic encapsulation type packaging to properly position the integrated circuit die or chip centrally in the injection mold, prior to encapsulation, to make sure that the die will be completely surrounded by the encapsulating plastic material.

In view of all these problems associated with plastic-encapsulated circuit die packaging, it would be highly desirable to provide a packaging structure and method wherein the low cost advantages of plastic packaging could be realized while overcoming the problems normally encountered with plastic packaging, in contrast to packaging utilizing ceramic materials.

SUMMARY OF THE INVENTION

It is, therefore, an object of this invention to provide a packaging structure and method for the packaging of integrated circuit dies which will provide the advantages of both plastic packaging and ceramic packaging.

In accordance with the invention a package for integrated circuit dies is provided comprising a ceramic base capable of having an integrated circuit die mounted to a central portion of one surface thereof to provide heat dissipation for the die; a lead frame with a central opening secured to the periphery of the same surface of the ceramic base; a raised frame member secured to both the lead frame and the peripheral portions of the same surface of the ceramic base exposed between the leads on the lead frame; a die mounted to the exposed central portion of the surface of the ceramic base surrounded by the lead frame and the raised frame member, and electrically bonded to leads on the lead frame; and a plastic potting material over and around the edges of the integrated circuit die and in contact with the exposed portion of the surface of the ceramic base adjacent the die, portions of the lead frame; and inner portions of the raised frame member.

The integrated circuit die package is formed by first bonding a lead frame having a central opening (no die paddle) to a peripheral portion of one surface of the ceramic base. A raised frame member is then bonded to the lead frame, and to the portions of the surface of the ceramic base which are exposed between the leads of the lead frame, leaving a central exposed portion of the surface of the ceramic base surrounded by the lead frame and raised frame member.

An integrated circuit die is then bonded to this central exposed portion of the surface of the ceramic base surrounded by the lead frame and raised frame member. The contacts on the die are then wire bonded to the leads on the lead frame.

A potting resin is then introduced over the top of the die and into the space between the die and the surrounding lead frame and raised frame member, to thereby contact the side surfaces of the integrated circuit die, the lead frame, the raised frame member, and exposed portions of the surface of the ceramic base between the die and the surrounding lead frame and raised frame member.

The final step is to expose the structure to an elevated temperature to cure the potting resin to complete the encapsulation of the integrated circuit die. The ceramic base and the cured potting resin then cooperate to completely surround or encapsulate the integrated circuit die, with the surrounding lead frame and raised frame member cooperating to form a lateral containment of the potting resin before it is cured.

DETAILED DESCRIPTION OF THE INVENTION

The invention comprises a novel packaging structure and method for packaging an integrated circuit die which combines the advantages of ceramic packaging with the advantages of plastic packaging to yield a low cost integrated circuit die package having improved heat dissipation over conventional plastic packages. The packaging method does not utilize injection molding, thereby eliminating the need for dams between the lead, or centering of the die in the mold of an injection press. The use of longer and thinner wires for wire bonding the die to the leads of the lead frame is also made possible by elimination of the high pressure injection molding technique. This, in turn, permits the same size packaging to be used with various sizes of integrated circuit dies.

Figure 1:
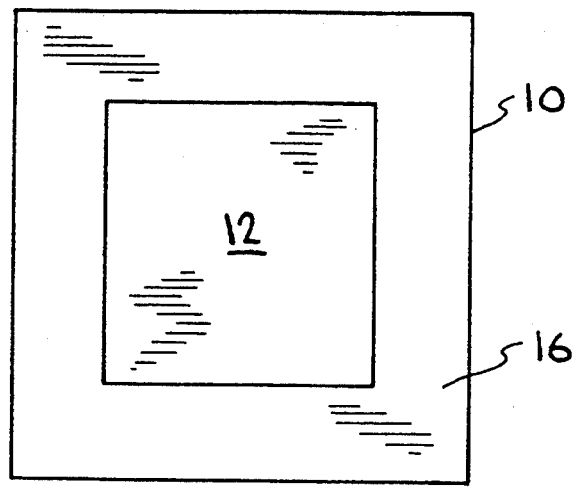
FIG. 1 is a top view of a ceramic base having a peripheral pattern of bonding resin formed on the surface thereof in preparation for bonding the lead frame to the ceramic base.

Turning now to FIG. 1, a planar ceramic base 10 is shown which forms a support and heat dissipation member to which an integrated die will eventually be bonded and which will also form one portion of the containment which provides encapsulation of the integrated circuit die.

Planar ceramic base 10 is shown in the form of a square, but it will be understood that ceramic base 10 may be formed having any convenient side dimensions or shapes. Generally, planar ceramic base 10 will be in the form of a rectangle more or less proportionally conforming in dimension to the shape of the die to be packaged therein to conserve on the amount of potting resin needed to eventually encapsulate the integrated circuit die, as will be explained in more detail below.

The thickness of ceramic base 10 may also vary from a minimum thickness needed for purposes of physical strength and integrity of the seal which ceramic base 10 forms over the undersurface of the integrated circuit die to be bonded thereto, up to a maximum thickness dictated by the overall bulk of the resulting package, as well as economics (e.g., the cost of the ceramic). Usually the thickness of ceramic base 10 will range from about 1 millimeter (mm) to about 2 mm, preferably from about 1.2 mm to about 1.6 mm, and typically will be about 1.4 mm in thickness.

Planar ceramic base 10 may comprise aluminum ($Al_2O_3$) or aluminum nitride (AlN) or any other ceramic material capable of dissipating heat generated by the integrated circuit die to be bonded thereto. Examples of other ceramic materials which may be used in the construction of planar ceramic base 10 may include, by way of illustration and not of limitation, silicon carbide; silicon nitride; and refractory metal oxides, nitrides, and borides.

Figure 2:
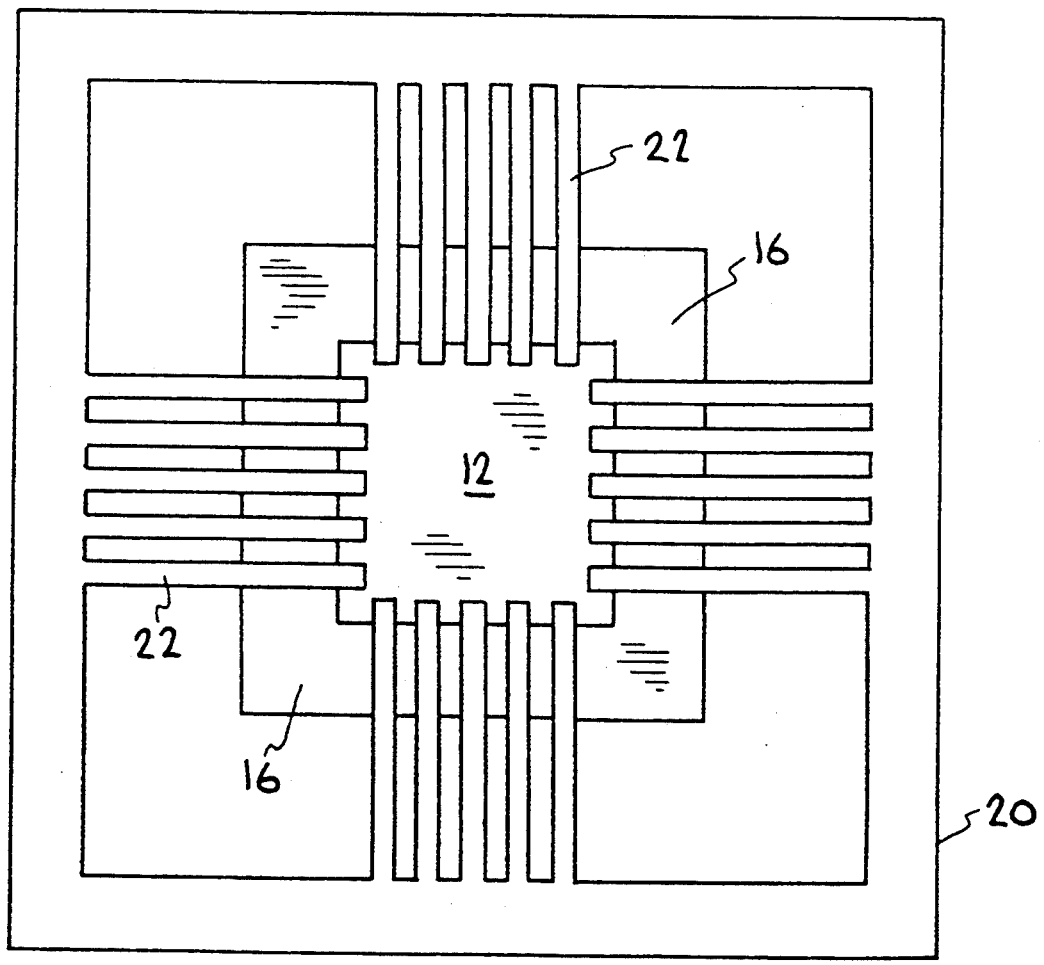
FIG. 2 is a top view of the structure of FIG. 1 with the lead frame shown positioned on the bonding resin pattern.

Formed on top surface 12 of planar ceramic base 10, in one embodiment, is a patterned layer of adhesive material 16 which is applied to surface 12 of ceramic base 10 to permit the bonding of a lead frame 20 thereto, as shown in FIG. 2. Alternatively, patterned adhesive layer 16 may be applied, in more or less the same pattern, to one side of lead frame 20, if desired. However, it will probably be found to promote ease of assembly if the patterned adhesive layer 16 is applied to surface 12 of ceramic base member 10.

Adhesive layer 16 is applied, in a rectangular pattern, to the periphery of surface 12 of ceramic base 10 prior to placement of lead frame 20 thereon, thereby leaving a large, usually rectangular, uncoated area in the central portion of surface 12 which will be subsequently used to mount and bond an integrated circuit die directly to surface 12 of ceramic base 10. Adhesive layer 16 may comprise any adhesive material capable of forming a bond between ceramic base 10 and metal lead frame 20 and which will be capable of withstanding subsequent curing and operating temperatures which may be as high as 300° C. Preferably, therefore, adhesive layer 16 will comprise a thermosetting resin, not a thermoplastic resin material.

More preferably, adhesive layer 16 will comprise a thermosetting resin capable of being partially polymerized to a b-stage, which comprises a partial curing or cross-linking of the thermosetting resin to a degree that it resembles cheese in that it is a non-sticky solid which is still flexible and capable of further curing and adherence to other materials upon application of heat.

Examples of thermosetting adhesive materials which may comprise adhesive layer 16, which are capable of being partially cured to a b-stage, and which are also capable of withstanding temperatures as high as 300° C., include epoxy resins; polyester resins; and polyimide resins.

Figure 3:
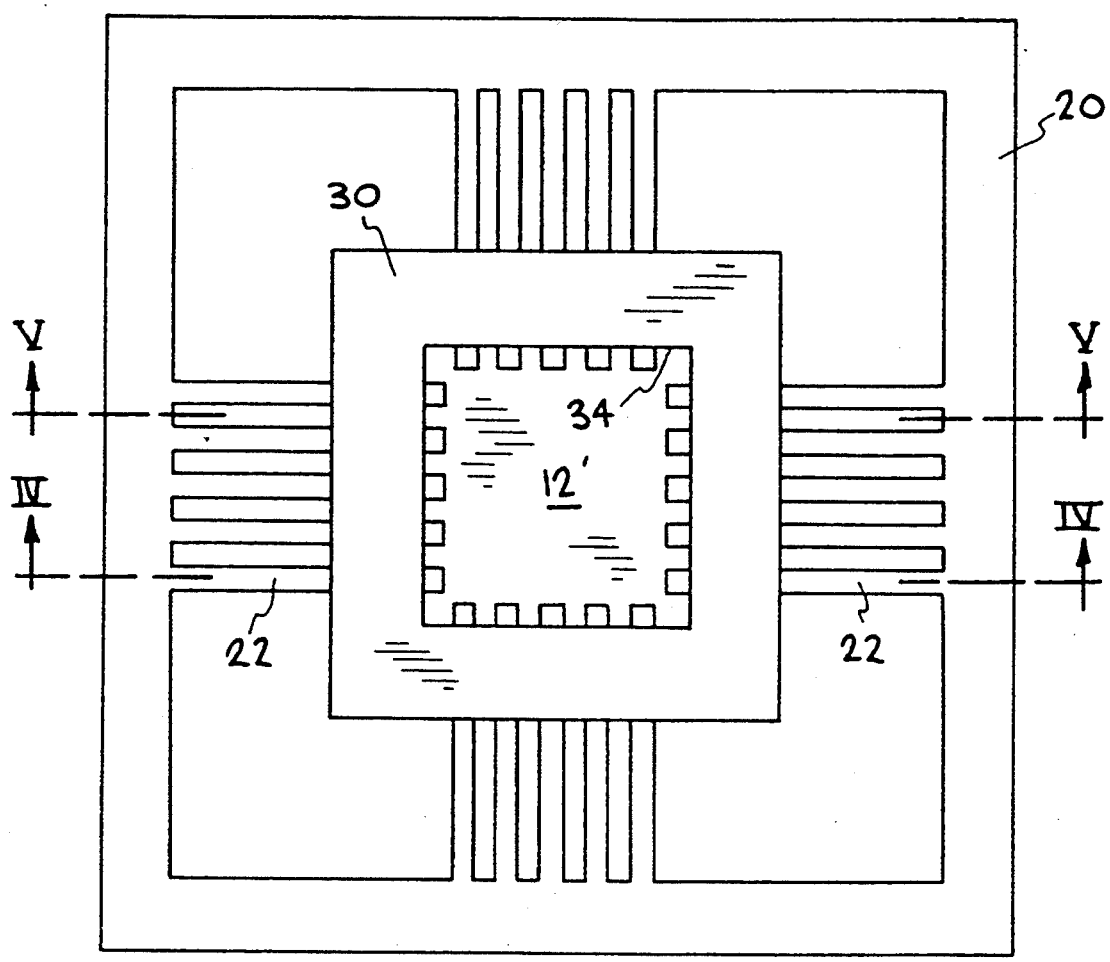
FIG. 3 is a top view of the structure of FIG. 2 with a raised frame member positioned over the portion of the lead frame on the surface of the ceramic base.

After lead frame 20 has been placed on ceramic base 10 and patterned adhesive layer 16, as shown in FIG. 2, a frame member 30 is placed over lead frame 20, as shown in FIG. 3. Frame member 30 comprises a planar structure, preferably made of the same material as used for ceramic base 10 (to provide a compatible thermal coefficient of expansion). Frame member 30 may, however, be constructed of any other suitable materials, such as a plastic material provided, however, that the material be capable of withstanding subsequent operating/curing temperatures of up to 300° C.

The purpose of frame member 30 is to form a lateral restraint or containment for a potting resin to be used in encapsulating the integrated circuit die, as will be explained below. Because of this, the height or thickness of frame member 30 must be sufficient to provide a total height equal to, or slightly greater than, the height of an integrated circuit die mounted onto ceramic base 10, as will be described below.

Preferably, frame member 30 (with an adhesive layer already in position on its undersurface as will be explained below) is applied over lead frame 20 and adhesive layer 16 prior to the bonding of lead frame 20 to ceramic base 10 and final curing of b-stage adhesive layer 16.

Frame member 30, as shown in FIG. 3, is preferably formed with an outer shape and dimensions generally conforming to the outer shape and dimensions of base 10. Frame member 30 has a central opening 34 formed therein preferably generally conforming to the shape of adhesive layer 16 formed on surface 12 of ceramic base 10. When frame member 30 is placed over lead frame 20, a central portion 12' of surface 12 of planar ceramic base 10 is left exposed for the eventual mounting of the integrated circuit die, as will be explained below.

To mount frame member 30 over lead frame 20, the undersurface of frame member 30 is preferably coated with an adhesive layer 36, which preferable comprises the same adhesive as adhesive 16 used to secure lead frame to surface 12 of ceramic base 10. Whether or not adhesive layer 36 comprises the same or a different material than the same material used for adhesive layer 16, adhesive layer 36 must also be capable of withstanding curing and operating temperatures as high as 300° C. Examples of adhesive materials which may be used for adhesive layer 36, when adhesive layers 16 and 36 are not the same, include epoxy resins; polyester resins; and polyimide resins.

To facilitate handling of frame member 30 with adhesive layer 36 thereon, adhesive layer 36 may also be precured to a b-stage similar to adhesive layer 16. Alternatively, adhesive layer 36 may be applied over lead frame 20 (without partially precuring it to a b-stage). In that case frame member 30 would then be placed on top of adhesive layer 36 and lead frame 30 and the composite then cured.

Figure 4:
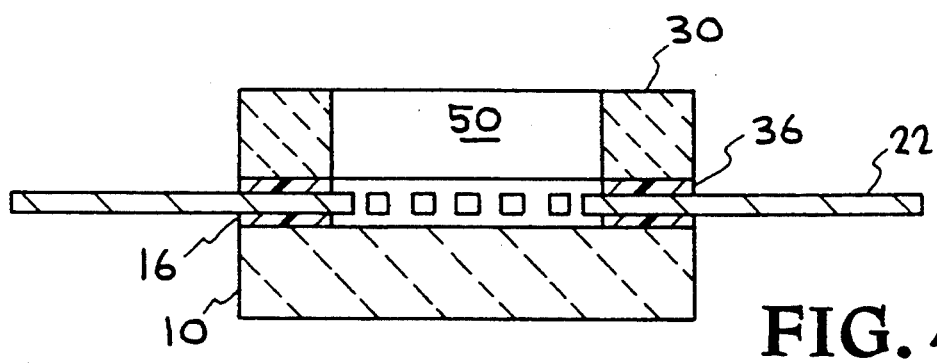
FIG. 4 is a vertical side-section of the structure of FIG. 3 taken along lines IV—IV to show the bonding of the ceramic base, lead frame, and raised frame member together.
Figure 5:
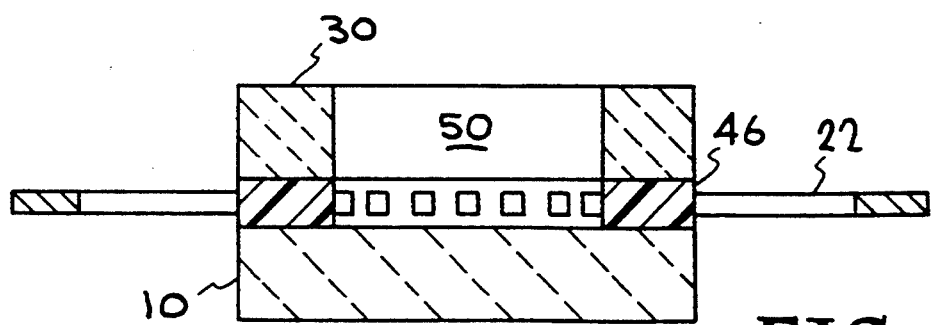
FIG. 5 is a vertical side-section of the structure of FIG. 3 taken along lines V—V to show the bonding of the ceramic base and raised frame member together at positions between adjacent leads on the lead frame.

In either event, the sandwich or composite comprising ceramic base 10, adhesive layer 16, lead frame 20, adhesive layer 36 and frame member 30 are preferably clamped together and placed in an oven or furnace and heated to a temperature ranging from about 100° C. to about 250° C., preferably ranging from about 150° C. to 200° C., and typically about 175° C., to cure adhesive layers 16 and 36 to thereby bond ceramic base member 10, lead frame 30 and frame member 30 together to form the structure shown in FIGS. 3–5.

As shown in FIG. 4, in those places where individual leads 22 are in between ceramic base 10 and frame member 30, the respective adhesive layers 16 and 36 bond to opposite sides of leads 22 to respectively bond leads 22 of lead frame 20 to ceramic base 10 and frame member 30.

In contrast, however, in the spaces between leads 22 of lead frame 20, as shown in FIG. 5, adhesive layer 16 and adhesive layer 36 merge together and are collectively shown as a single adhesive layer (designated for illustrative purposes by numeral 46) which bonds ceramic base 10 and frame member 30 together directly.

This filling, by adhesive layers 16 and 36, of the spaces bounded by upper surface 12 of ceramic base 10, the undersurface of frame member 30, and the side edges of adjacent leads 22 of lead frame 20 eliminates the need for the dams between leads required in prior art plastic encapsulation processes.

Figure 6:
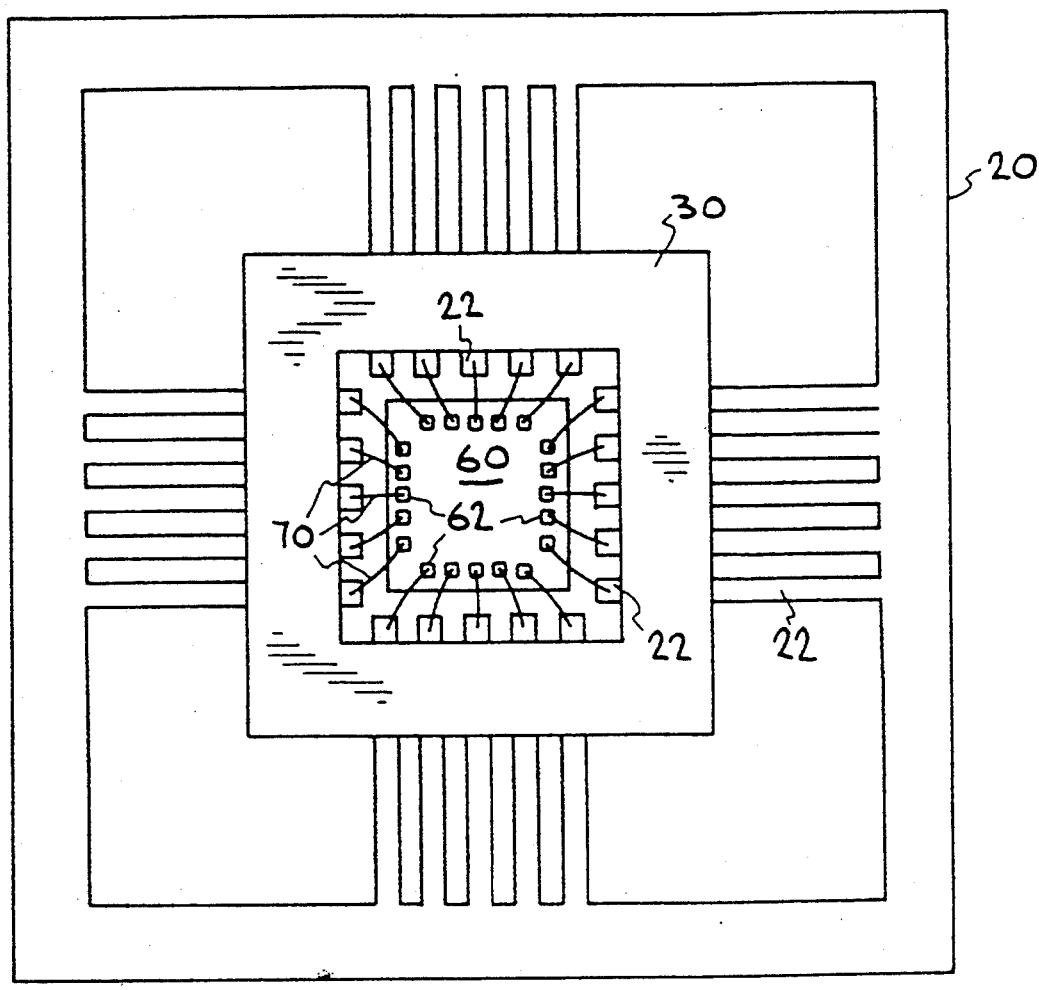
FIG. 6 is a top view of the structure of FIG. 3 with an integrated circuit die centrally bonded to the same surface of the ceramic base and laterally surrounded by the lead frame and raised frame member, with wire bonding shown between the die and leads on the lead frame.
Figure 7:
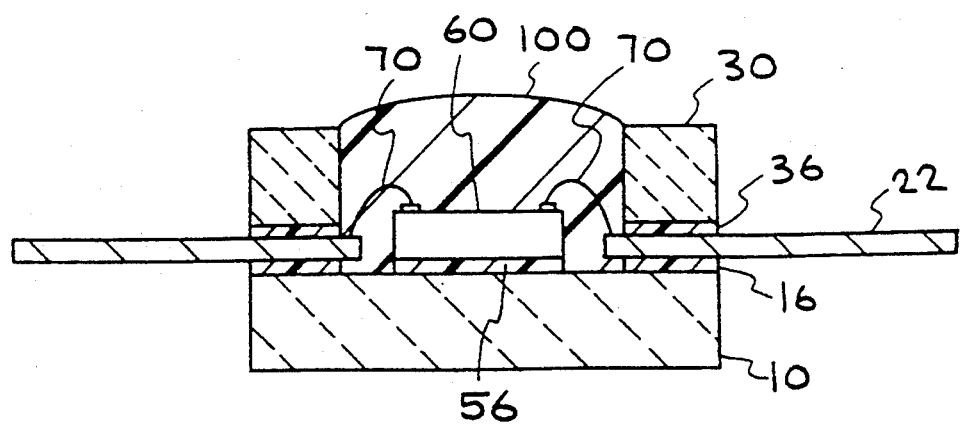
FIG. 7 is a vertical side section of the structure of FIG. 6 after a potting resin has been applied to the top surface of the integrated circuit die to flow over the top of the die and into the spaces between the edges of the die and the inner edges of the lead frame and raised frame member.

The result is a space 50, as shown in FIGS. 4 and 5, bounded on the bottom by surface 12' of ceramic base 10, and laterally on all four sides by the composite of lead frame 20, adhesive layers 16 and 36, and frame member 30. Into this space 50 is placed an integrated circuit die 60, as seen in FIGS. 6 and 7, which is bonded directly to exposed surface 12' of ceramic base 10 by adhesive 56. It should be noted that the thicknesses shown for the various layers in the figures, have in some cases have been exaggerated, for illustrative purposes only, and, therefore, should not be deemed to be proportional to the actual dimensions.

Adhesive 56 may conveniently comprise the same adhesive material as used in forming adhesive layers 16 and 36. However, it is not necessary that adhesive 56 be capable of forming an intermediate b-stage level of curing, since integrated circuit die 60 will normally be mounted on adhesive layer 56 immediately after it is applied to surface 12' of ceramic base 10.

Furthermore, adhesive 56, unlike the adhesive(s) used for adhesive layers 16 and 36, will be in direct contact with integrated circuit die 60, thereby necessitating a high level of purity, with respect to materials which might otherwise migrate into the integrated circuit die, e.g., into a silicon substrate. More particularly, adhesive 56 must contain no more than 10 ppm each of impurities such as halogens (F, Cl, Br, etc.); alkali metals (Li, Na, K, etc.); or alkaline earth metals (Mg, Ca, Sr, Ba, etc.). However, adhesive 56, like adhesives 16 and 36, must be capable of withstanding curing and operating temperatures as high as 300° C. Examples of high purity adhesive materials which may be used for adhesive layer 56, when adhesive layer 56 is not the same as either layers 16 and 36, include epoxy resins and polyimide resins.

In a preferred embodiment, adhesive 56 may be filled with a chemically inert metal having good heat conductivity such as, for example, silver to increase the thermal conductivity of adhesive 56 to thereby enhance the thermal coupling of die 60 to ceramic base 10 whereby heat generated by die 60 may be more effectively transmitted to ceramic base 10. Examples of high purity silver-filled epoxy resins which may be used for adhesive 56 include, for example, Ablebond 84-1LMIS or Hitachi EN4000.

After integrated circuit die 60 has been secured to ceramic base 10 by adhesive 56, die 60 is electrically connected (wire bonded) to lead frame 20 through wires 70, each attached at one end to one of a plurality of contacts 62 on die 60, and at the opposite end to the inner end of one of the individual leads 22, as shown in FIGS. 6 and 7.

It should be noted in this regard that while only five contacts 62 and leads 22 are shown on each side of the package, this is only for purposes of illustration. In actual practice, many more leads and contacts can and will be placed on each side of the package, as is well known to those skilled in the art.

After the wire bonding step has been completed, integrated circuit die 60 is encapsulated in a potting resin 100 which is flowed over die 60 in a sufficient amount to fill the remainder of space 50 between die 60 and the sidewalls of frame member 30. As stated above, the thickness of frame member 30 is sufficient to be equal to or slightly greater than the height of integrated circuit die to thereby provide a lateral restraint or dam to contain the potting resin prior to the curing of same to ensure that the surfaces of die 60 not already bonded to ceramic base 10 will be completely surrounded by potting resin 100.

Potting resin 100 may comprise a material similar or identical to adhesive material 56 used to bond die 60 to ceramic base 10, but in any event resin 100 must possess the same purity as adhesive material 56, i.e., contain not more than 10 ppm of the previously specified undesirable materials with respect to material 56, because of the contact of potting resin 100 with die 60.

In addition, however, potting resin 100 should be chosen to have a sufficiently low viscosity to facilitate introducing the material over the surface of die 60 and around the sides of the die. Also, introducing fillers into the resin will serve to reduce the thermal expansion and resulting thermal stress on die 60. Therefore, in a preferred embodiment, potting resin 100 will contain from about 50 to about 75 wt. % of chemically nonreactive fillers.

It should be noted in this regard, that potting resin 100 need not possess the adhesive strength of resins 16, 36, or 56, which makes possible the addition of further filler materials without reduction of desired adhesive properties. However, potting resin, like adhesives 16, 36, and 56, must be capable of withstanding curing and operating temperatures as high as 300° C.

However, since potting resin 100 will be in direct contact with wires 70, resin 100 should not contain any electrically conductive fillers therein, unlike adhesive 56 which preferably contains a metal filler to enhance the thermal transmission of adhesive 56. A high purity epoxy resin, without such conductive fillers, but with other viscosity modifying fillers, which may be used as potting resin 100, by way of example, is HYSOL CB011 epoxy resin. Other examples of materials which may be used for potting resin 100 include polyimide resins and polyester resins.

After a sufficient amount of potting resin 100 has been flowed over die 60 to completely cover it, the structure may again be placed in an oven or furnace and heated to a temperature ranging from about 100° C. to about 250° C., preferably ranging from about 150° C. to 200° C., and typically about 175° C., to cure potting resin 100. It should be noted that adhesive 56 must be cured prior to application of potting resin 100 to allow for wire bonding of contacts 62 on die 60 to leads 22 with wires 70.

It should also be noted, with respect to the bonding wires, that both the thickness and the length of bonding wires 70 may vary considerably from the sizes of the bonding wires of the prior art because of the absence of forces exerted upon wires 70 by plastic materials being injected under high pressure into a mold. Because of the elimination of such injection molding pressures, wires 70 may be made longer without risking a shorting out of adjacent wires by distortion such as bending caused by high pressure plastic injection. Furthermore, wires 70 need not be as heavy a gauge, again because of the absence of such molding pressures of the prior art which could distort wires 70, unless they were made of a heavy enough gauge to resist such pressures.

In addition, since the length and gauge of wires 70 is no longer critical in view of the elimination of such molding pressures, the same size packaging structure of the invention, as just described, may be utilized with a number of different size integrated circuit dies. This, in turn, means that the same outer package and lead configuration and geometry, can be used with the same socket on a circuit board for a number of different dies.

To evaluate the package and method of making same of the invention, an 11 mm$^2$ die was mounted in a packaging structure as just described, using a 28 mm×28 mm aluminum oxide base having a thickness of 1.4 mm and a similar sized aluminum oxide frame member having an inner opening of 20 mm×20 mm. An aluminum lead frame was used and an epoxy resin was used as the adhesive material used to bond the frame member, lead frame, and alumina base together. A silver-filled epoxy resin was used to bond a 11 mm×11 mm silicon die to the surface of the alumina base. HYSOL CB011 epoxy resin was used as the potting resin to encapsulate the integrated circuit die.

The epoxy adhesive used to bond the alumina base, lead frame, and alumina frame member together was cured at 175° C. for 1 hour. The silver-filled epoxy adhesive used to bond the die to the alumina base and the HYSOL epoxy potting resin used to encapsulate the die were subsequently cured, also at 175° C. for 1 hour.

A number of integrated circuit packages so constructed were then subjected to a number of standard tests to evaluate the performance of the package. The packages were subjected to standard thermal shock (15 cycles) and temperature (>1000 cycles) tests cycling in the −65° C. to 150° C. temperature range and found to be satisfactory. The packages were also subjected to a standard bias/humidity test (85° C./85% R/H) for 1000 hours and a standard autoclave (pressure pot at 121° C./2.1 atm) test for 96 hours and also found to perform in a satisfactory manner.

Thus, the invention provides an improved integrated circuit die package and method of making same wherein the economics of plastic packaging have been preserved while the use of high pressure injection molding of plastic into a mold has been eliminated. This, in turn, eliminates the need for metal dams placed between adjacent leads and the need to remove same after the molding step. It also eliminates the need for special heat sinks and for providing means for centering the die in the mold, and permits the use of larger and/or thinner bonding wires, which, in turn, permits the same size package to be used with various sizes of integrated circuit dies.

Having thus described the invention what is claimed is:

1. A method of forming a package for an integrated circuit die comprising:
    a) providing a planar ceramic base having a first surface thereon and capable of functioning as a heat sink to dissipate heat generated by an integrated circuit die subsequently thermally coupled thereto;
    b) bonding to the periphery of said first surface of said ceramic base a lead frame with a central opening;
    c) bonding to both said lead frame and the peripheral potions of the same surface of said ceramic base exposed between leads on said lead frame a raised frame member having a thickness greater than the thickness of the integrated circuit die to be bonded to said planar ceramic base, and having a central opening therein to thereby form a recessed opening bounded by said planar ceramic base, said lead frame, and said raised frame member;
    d) bonding an integrated circuit die to an exposed central portion of said first surface of said ceramic base in said recessed opening surrounded by said lead frame and said raised frame member using a high purity thermally conductive adhesive:

i) containing no more than 10 ppm of any halogen, alkali metal. Or alkaline earth metal impurity;
ii) capable of withstanding a temperature of at least 300° C; and
iii) containing a thermally conductive filler capable of enhancing thermal coupling of said die to said ceramic base; to thereby thermally couple said die to said ceramic base;

e) electrically connecting said die to leads on said lead frame; and f) placing a curable high purity plastic potting material, containing no more than 10 ppm of any halogen, alkali metal, or alkaline earth metal impurity, in said recessed opening over and around the edges of said integrated circuit die, and in the space between said die and said lead frame and said frame member, and in contact with the exposed portion of said first surface of said ceramic base adjacent said die, whereby said ceramic base and said plastic potting material completely surround said integrated circuit die, said walls of said recessed opening, comprising said lead frame and said raised frame member, acting to form a dam to retain said potting material around and over said die prior to curing of said potting material; and g) heating said structure to a temperature sufficient to cure said potting material to thereby encapsulate said die without deforming said ceramic base.

2. The method of claim 1 including the further step of securing said lead frame to said ceramic base with a first adhesive capable of withstanding a temperature of as high as 300° C.

3. The method of claim 2 wherein said further step of securing said lead frame to said ceramic base with a first adhesive further comprises securing said lead frame to said ceramic base with a thermosetting adhesive.

4. The method of claim 3 wherein said step of securing said lead frame to said ceramic base with a thermosetting first adhesive further comprises applying a partially cured thermosetting adhesive to peripheral portions of said first surface of said ceramic base prior to contact with said lead frame.

5. The method of claim 2 including the further step of securing said raised frame member to both said lead frame and said ceramic base with a second adhesive capable of withstanding a temperature of as high as 300° C.

6. The method of claim 5 wherein said further step of securing said raised frame member to both said lead frame and said ceramic base with a second adhesive capable of withstanding a temperature of as high as 300° C. further comprises securing said raised frame to both said lead frame and said ceramic base with a second adhesive comprising a thermosetting adhesive.

7. The method of claim 6 wherein said step of securing said raised frame to both said lead frame and said ceramic base with said thermosetting second adhesive further comprises applying a partially cured thermosetting second adhesive to one surface of said raised frame member prior to contact with said lead frame and said ceramic base.

8. The method of claim 5 wherein said first and second adhesives comprise the same adhesive material.

9. The method of claim 5 which further comprises curing both said first and second adhesives at the same time.

10. The method of claim 1 which further comprises selecting said raised frame member from the group of materials consisting of a ceramic material and a plastic material capable of withstanding a temperature of 300° C.

11. The method of claim 10 which further comprises selecting a ceramic raised frame member.

12. The method of claim 10 which further comprises selecting the same ceramic material for said raised frame member as the ceramic material comprising said ceramic base.

13. The method of claim 1 which further comprises selecting a high purity adhesive containing silver as said thermally conductive filler.

14. The method of claim 1 which further comprises selecting a high purity epoxy adhesive.

15. The method of claim 1 which further comprises selecting a potting material comprising a thermosetting resin capable of withstanding a temperature of as high as 300° C.

16. The method of claim 15 which further comprises selecting a potting material comprising a thermosetting resin containing from about 50 wt. % to about 75 wt. % of chemically non-reactive fillers to control the viscosity and reduce thermal stress on said die.

17. The method of claim 16 which further comprises selecting an epoxy resin as said potting material.

18. A method of forming a package for an integrated circuit die comprising:
a) providing a planar ceramic base having a first surface thereon and formed from a material capable Of dissipating heat from an integrated circuit die to be bonded thereto;
b) securing a lead frame with a central opening to the periphery of said first surface of said ceramic base with a first epoxy adhesive capable of withstanding a temperature of 300° C.;
c) securing a ceramic raised frame member, having a thickness greater than the thickness of said integrated circuit die and having a central opening therein, to both said lead frame and the peripheral portions of the same surface of said ceramic base exposed between leads on said lead frame with a second epoxy adhesive capable of withstanding a temperature of 300° C. to thereby form a central recessed region on said planar ceramic base;
d) mounting an integrated circuit die to an exposed central portion of said first surface of said ceramic base in said recessed region formed by said lead frame and said raised frame member with a high purity silver-filled epoxy adhesive capable of withstanding a temperature of 300° C. and containing no more than 10 ppm of any halogen, alkali metal, or alkaline earth metal impurity to thermally couple said die to said ceramic base;
e) electrically connecting said integrated circuit die to leads on said lead frame; and
f) placing a curable epoxy potting material over and around the edges of said integrated circuit die, and in the space between said die and said lead frame and said frame member in said recessed region, and in contact with the exposed portion of said first surface of said ceramic base adjacent said die, said recessed region formed by said lead frame and said frame member acting as a dam to retain said curable epoxy potting material around and over said die until mid curable epoxy potting material is cured, said epoxy potting material being capable of withstanding a temperature of 300° C. and containing no more than 10 ppm of any halogen, alkali metal, or alkaline earth metal impurity, whereby said ceramic base and said epoxy potting resin completely surround said integrated circuit die; and g) then heating said structure to a temperature not exceeding 300° C., but sufficient to cure said epoxy potting material to thereby encapsulate said die in said package.

19. The method of claim 18 which further comprises selecting the same epoxy adhesive material for both said first and second epoxy adhesives.

20. The method of claim 18 which further comprising selecting the same ceramic material for said raised ceramic frame member as the ceramic material comprising said ceramic base.

* * * * *

UNITED STATES PATENT AND TRADEMARK OFFICE
CERTIFICATE OF CORRECTION

PATENT NO. : 5,441,918

DATED : August 15, 1995

INVENTOR(S) : Masayuki Morisaki, Hiroshi Matsumoto, and Shoji Uegaki

It is certified that error appears in the above-identified patent and that said Letters Patent is hereby corrected as shown below:

Title Page:

Item [75], Inventors, col. 1, line 1, change "Maysayuki" to "Masayuki".

Col. 8, line 56, claim 1, change "potions" to "portions".

Col. 9, line 2, claim 1, change "metal. Or alkaline" to "metal, or alkaline".

Col. 10, line 30, claim 18, change "Of" to "of".

Col. 10, line 65, claim 18, change "mid" to "said".

Signed and Sealed this

Twenty-sixth Day of December, 1995

*Attest:*

BRUCE LEHMAN

*Attesting Officer*     *Commissioner of Patents and Trademarks*